(12) United States Patent
Chiang et al.

(10) Patent No.: US 10,164,112 B2
(45) Date of Patent: Dec. 25, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Hung-Li Chiang, Taipei (TW); I-Sheng Chen, Taipei (TW); Chi-On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/487,559

(22) Filed: Apr. 14, 2017

(65) Prior Publication Data

US 2018/0301558 A1    Oct. 18, 2018

(51) Int. Cl.
| | | |
|---|---|---|
| H01L 29/78 | (2006.01) | |
| H01L 29/06 | (2006.01) | |
| H01L 29/08 | (2006.01) | |
| H01L 29/66 | (2006.01) | |
| H01L 21/02 | (2006.01) | |
| H01L 21/762 | (2006.01) | |
| H01L 21/311 | (2006.01) | |

(52) U.S. Cl.
CPC ...... *H01L 29/7851* (2013.01); *H01L 21/0206* (2013.01); *H01L 21/31111* (2013.01); *H01L 21/762* (2013.01); *H01L 29/0649* (2013.01); *H01L 29/0692* (2013.01); *H01L 29/0847* (2013.01); *H01L 29/6656* (2013.01); *H01L 29/66545* (2013.01); *H01L 29/66795* (2013.01)

(58) Field of Classification Search
CPC ............. H01L 29/7851; H01L 29/6656; H01L 29/66795; H01L 29/0649; H01L 29/0692; H01L 29/0847; H01L 21/0206
See application file for complete search history.

(56) References Cited

U.S. PATENT DOCUMENTS

| | | | | |
|---|---|---|---|---|
| 2009/0057771 A1* | 3/2009 | Fukasaku | .......... | H01L 21/28097 257/369 |
| 2011/0127610 A1* | 6/2011 | Lee | ................. | H01L 21/823431 257/365 |
| 2012/0267614 A1* | 10/2012 | Tajima | ................ | H01L 51/0096 257/40 |
| 2013/0277686 A1* | 10/2013 | Liu | ...................... | H01L 29/6653 257/77 |
| 2014/0312398 A1* | 10/2014 | Ching | ............... | H01L 29/66795 257/288 |
| 2015/0031182 A1* | 1/2015 | Perng | .................... | H01L 29/165 438/283 |

(Continued)

*Primary Examiner* — Christine A Enad
(74) *Attorney, Agent, or Firm* — McClure, Qualey & Rodack, LLP

(57) ABSTRACT

A semiconductor device includes a substrate; at least one source/drain feature at least partially disposed in the substrate; an isolation structure disposed on the substrate and includes a first portion; a gate structure disposed on the first portion of the isolation structure and adjacent to the source/drain feature; and at least one gate spacer disposed on a sidewall of the gate structure, in which a top surface of the first portion of the isolation structure is in contact with the gate structure and is higher than a bottommost surface of the gate spacer.

20 Claims, 18 Drawing Sheets

(56) References Cited

U.S. PATENT DOCUMENTS

| | | | |
|---|---|---|---|
| 2015/0035046 A1* | 2/2015 | Kim | H01L 29/42392 |
| | | | 257/327 |
| 2015/0041899 A1* | 2/2015 | Yang | H01L 27/0922 |
| | | | 257/351 |
| 2015/0228647 A1* | 8/2015 | Chang | H01L 21/823431 |
| | | | 257/401 |
| 2016/0020335 A1* | 1/2016 | Bentley | H01L 29/45 |
| | | | 257/256 |
| 2016/0035861 A1* | 2/2016 | Park | H01L 29/66545 |
| | | | 438/301 |
| 2017/0084461 A1* | 3/2017 | Colinge | H01L 21/3085 |
| 2017/0141107 A1* | 5/2017 | Kim | H01L 23/5283 |
| 2017/0148877 A1* | 5/2017 | Jung | H01L 29/0847 |
| 2017/0271335 A1* | 9/2017 | Yang | H01L 27/0922 |
| 2017/0309725 A1* | 10/2017 | Duriez | H01L 29/78696 |

* cited by examiner

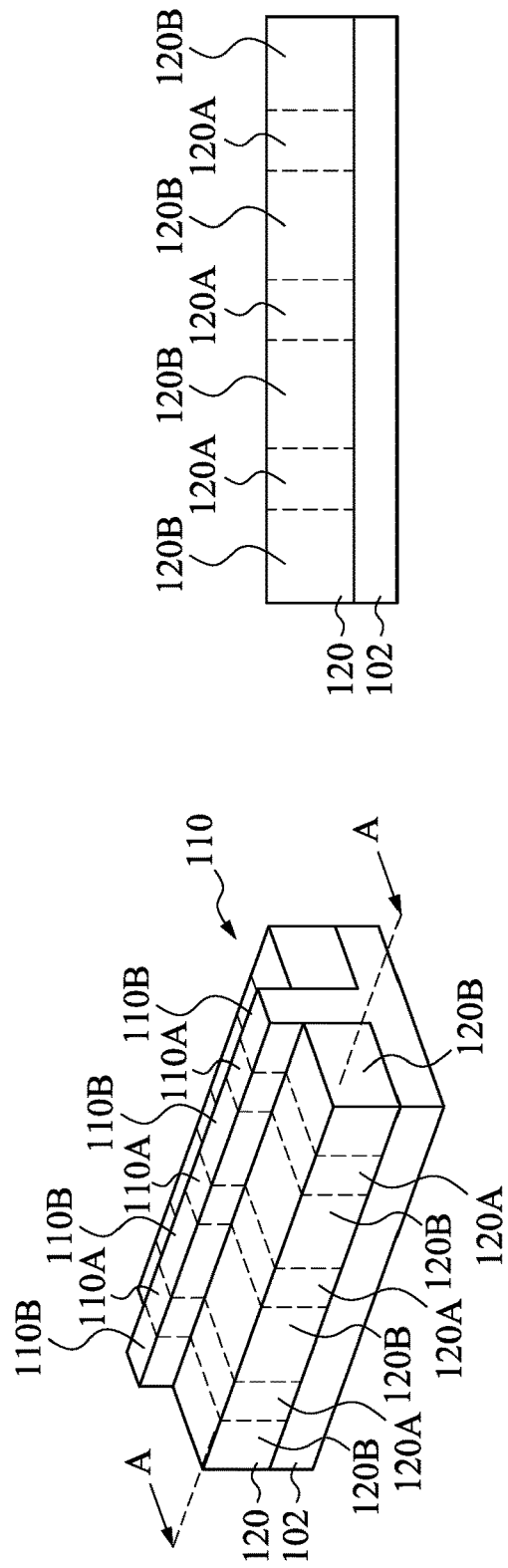

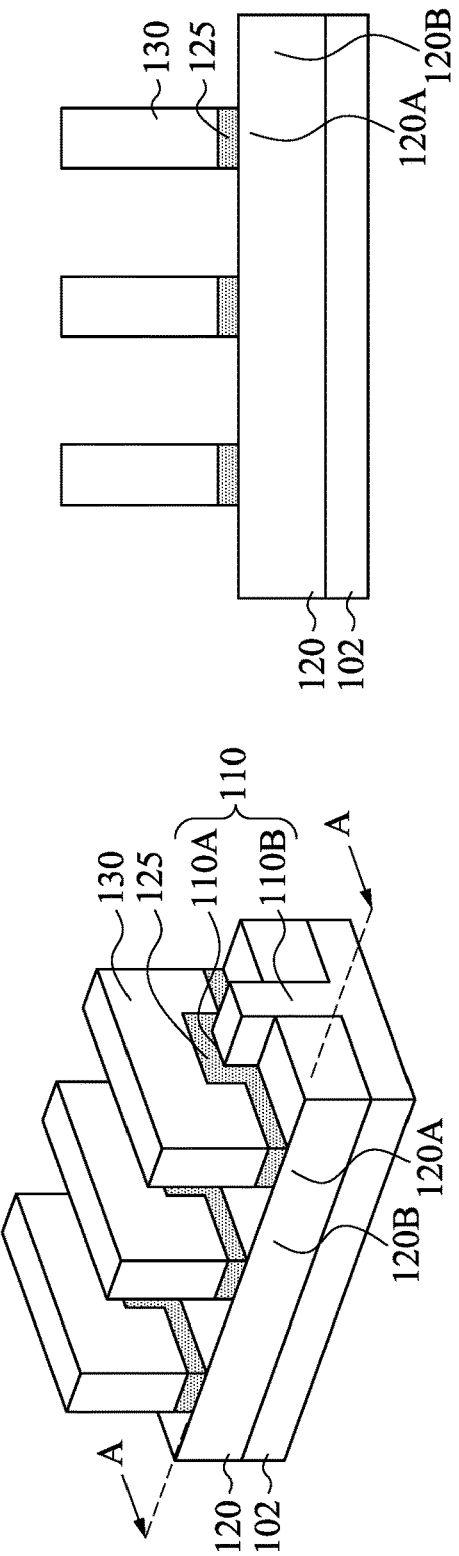

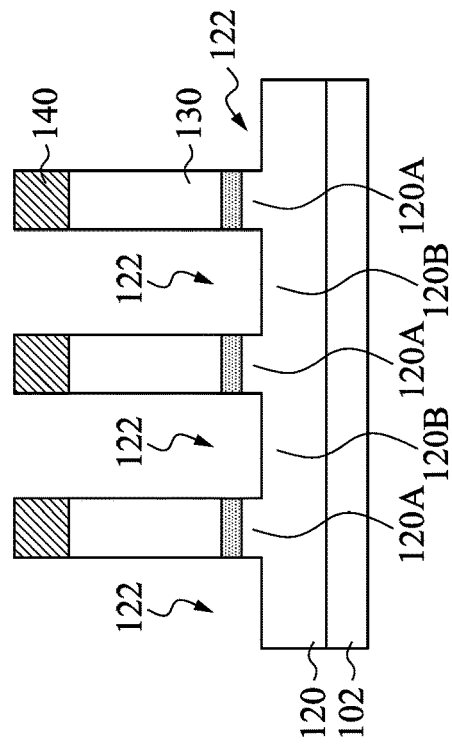
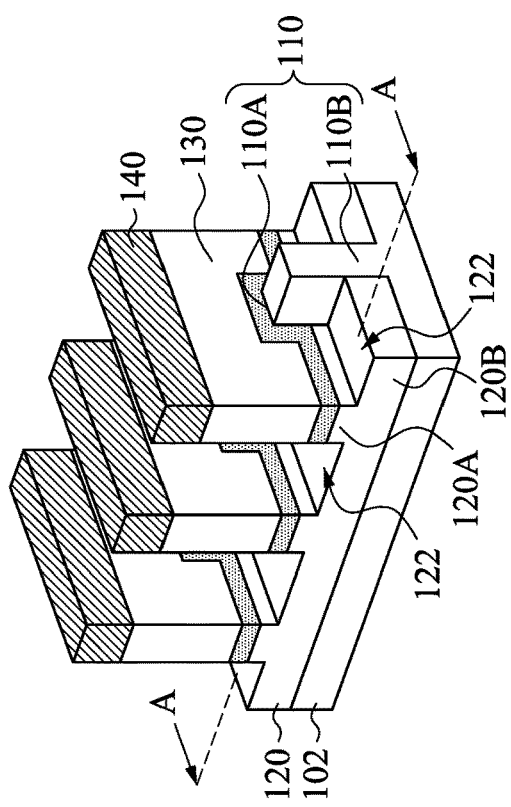
Fig. 3B
Fig. 3A

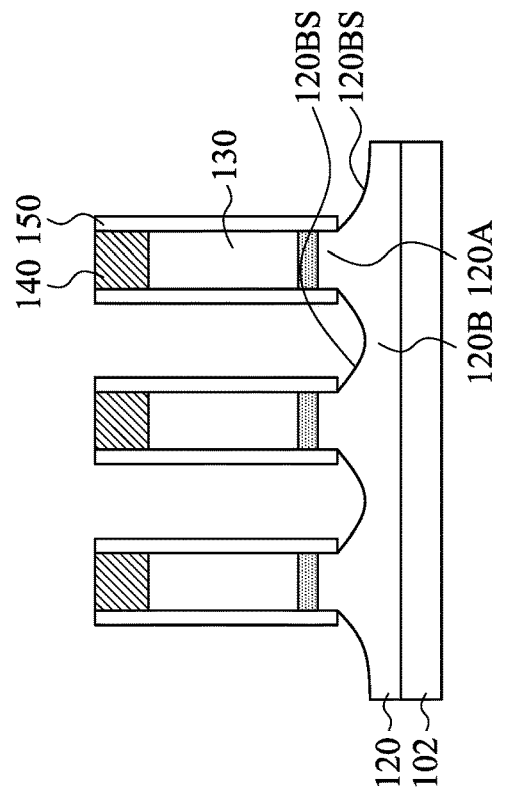
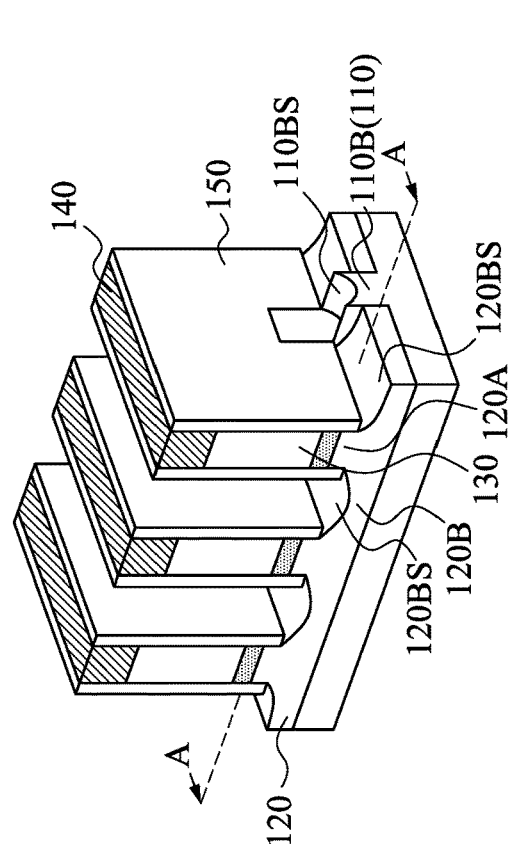
Fig. 6A
Fig. 6B

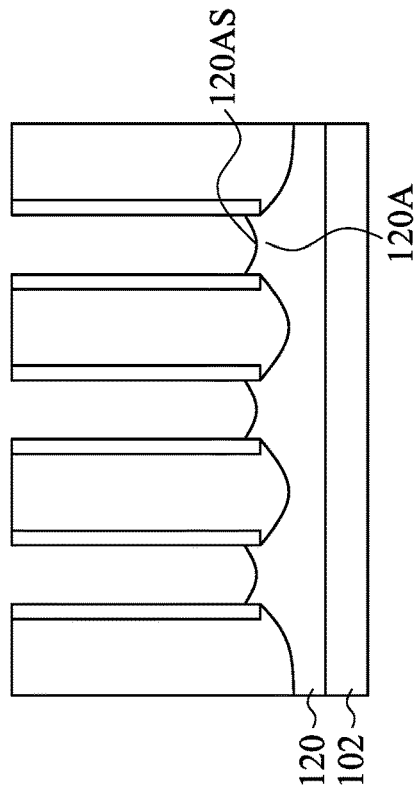
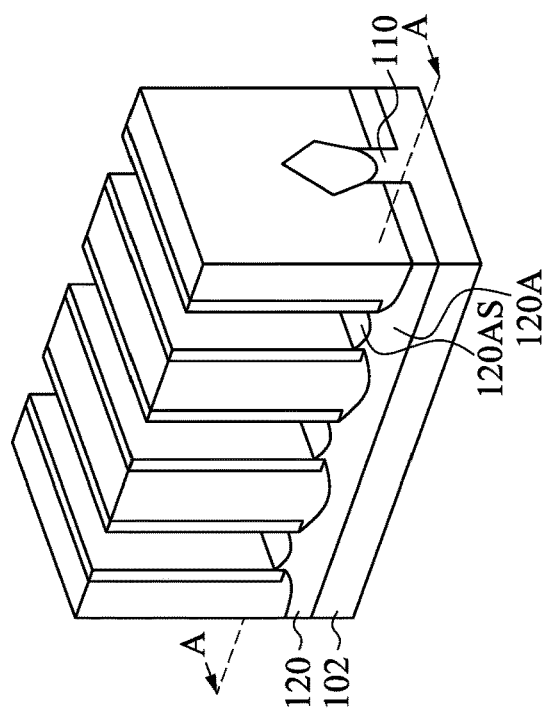
Fig. 10B
Fig. 10A

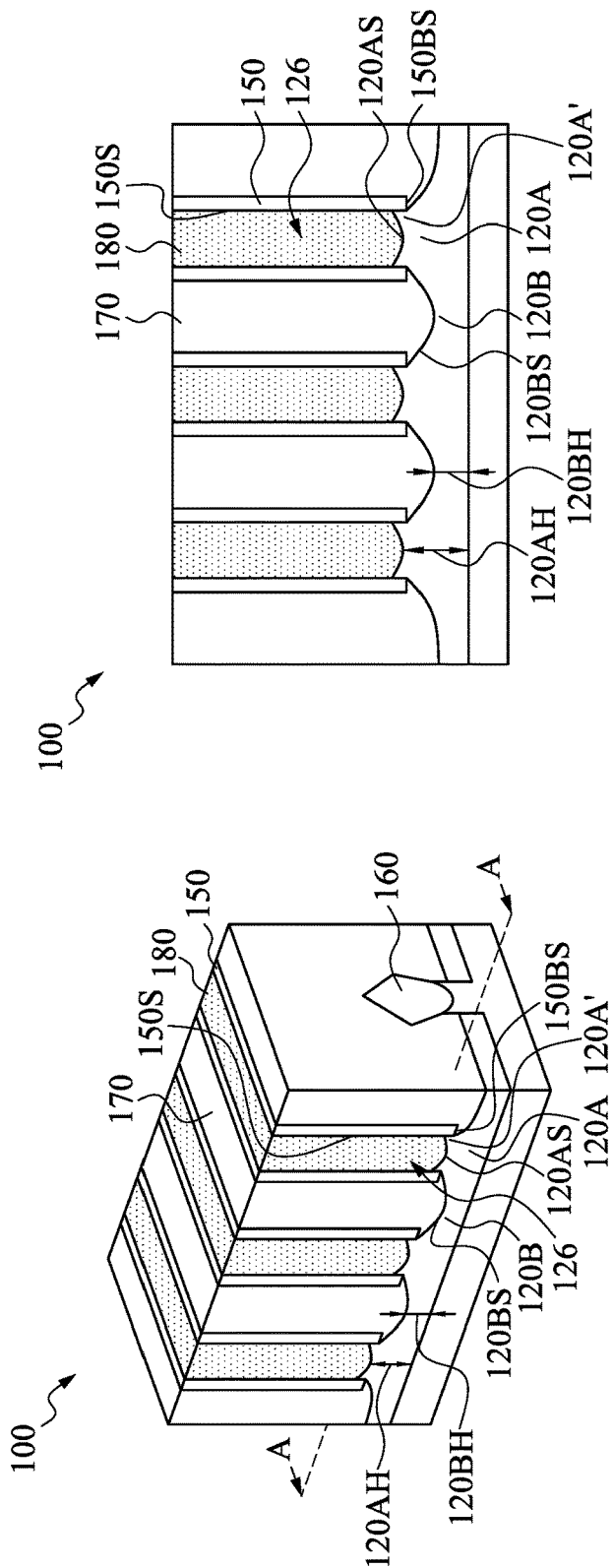

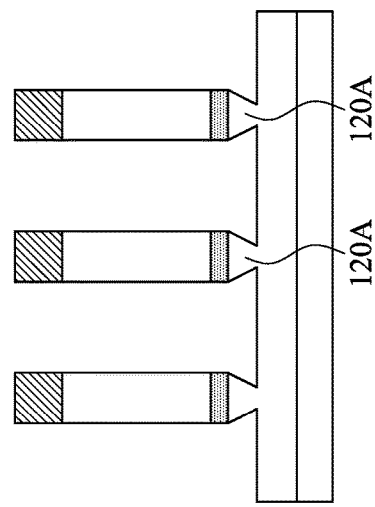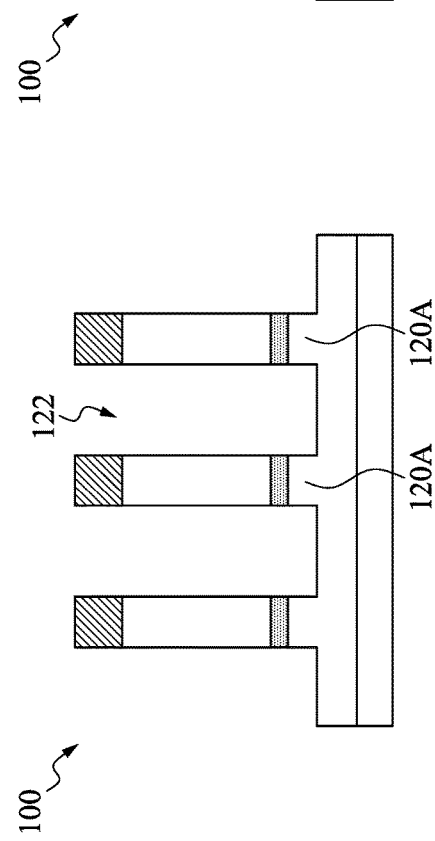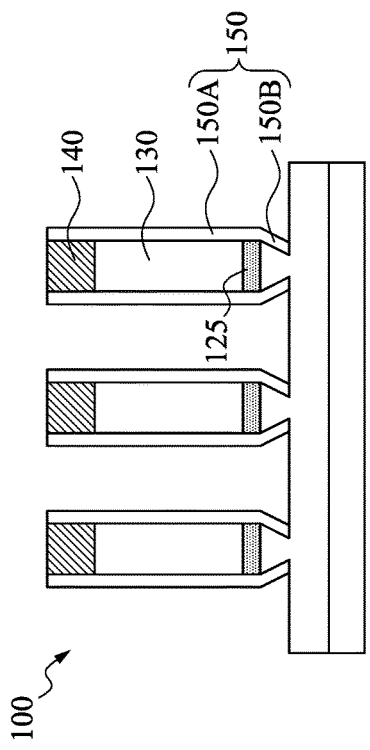
Fig. 13B
Fig. 13A
Fig. 13C

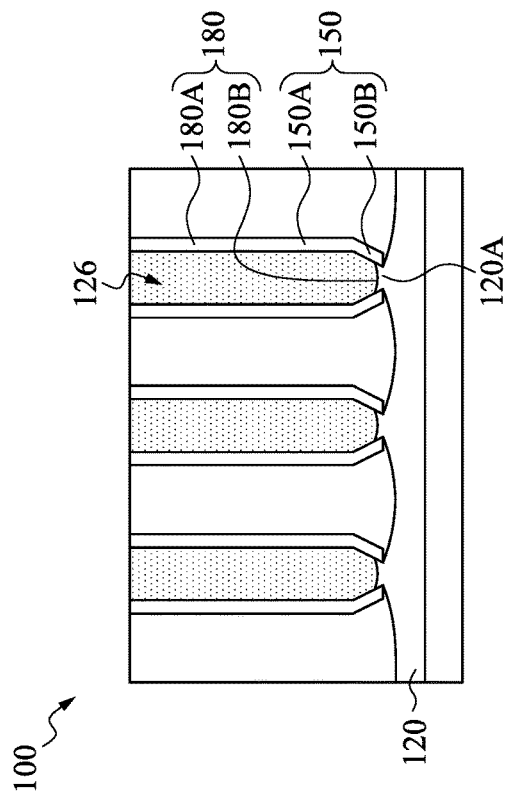
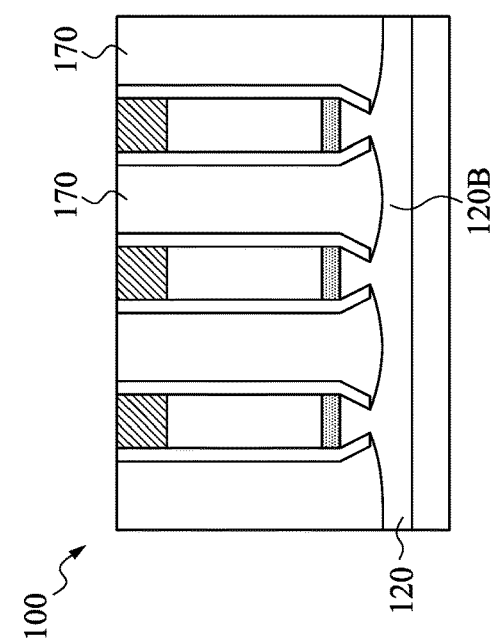
Fig. 13E
Fig. 13D

SEMICONDUCTOR DEVICE AND MANUFACTURING METHOD THEREOF

BACKGROUND

Semiconductor devices are small electronic components that are fabricated on a semiconductor wafer substrate. Using a variety of fabrication techniques, these devices are made and connected together to form integrated circuits. A number of integrated circuits may be found on one chip, and are capable of performing a set of useful functions in the operation of an electronic appliance. Examples of such electronic appliances are mobile telephones, personal computers, and personal gaming devices. As the size of these popular devices would imply, the components formed on a chip are small.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5, 6A, 7, 8A, 9A, 10A, and 11A are perspective views of a method for manufacturing a semiconductor device at various stages in accordance with some embodiments of the present disclosure.

FIGS. 1B, 2B, 3B, 4B, 6B, 8B, 9B, 10B, and 11B are cross-sectional views taking along line A-A of FIGS. 1A, 2A, 3A, 4A, 6A, 8A, 9A, 10A, and 11A.

FIGS. 13A-13E are cross-sectional views of a method for manufacturing a semiconductor device at various stages in accordance with some embodiments of the present disclosure.

DETAILED DESCRIPTION

Figure 4B:
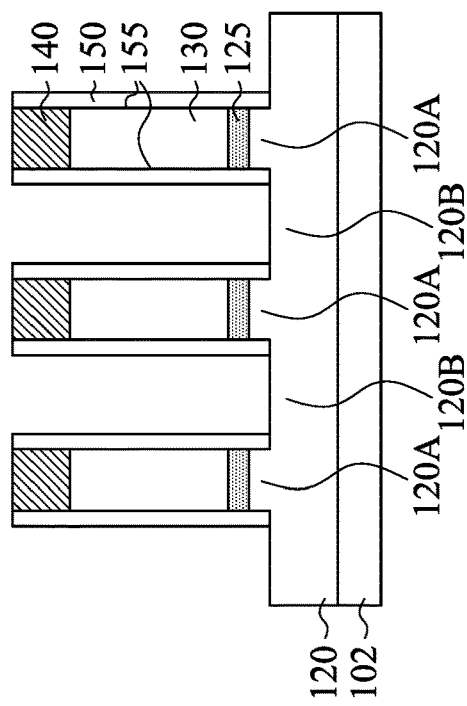

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A, 2A, 3A, 4A, 5, 6A, 7, 8A, 9A, 10A, and 11A are perspective views illustrating sequential processes for manufacturing a semiconductor device 100 in accordance with some embodiments of the present disclosure. FIGS. 1B, 2B, 3B, 4B, 6B, 8B, 9B, 10B, and 11B are cross-sectional views along line A-A of FIGS. 1A, 2A, 3A, 4A, 6A, 8A, 9A, 10A, and 11A.

Reference is made to FIGS. 1A and 1B. A substrate 102 is provided. The substrate 102 may be a bulk silicon substrate. Alternatively, the substrate 102 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 102 also include a silicon-on-insulator (SOI) substrate. SOI substrates are fabricated using separation by implantation of oxygen (SIMOX), wafer bonding, and/or other suitable methods.

Some exemplary substrate 102 also includes an insulator layer. The insulator layer comprises suitable materials, including silicon oxide, sapphire, and/or combinations thereof. An exemplary insulator layer may be a buried oxide layer (BOX). The insulator is formed by one or more suitable process(es), such as implantation (e.g., SIMOX), oxidation, deposition, and/or other suitable process. In some exemplary semiconductor device 100, the insulator layer is a component (e.g., layer) of a silicon-on-insulator substrate.

The substrate 102 may also include various doped regions. The doped regions may be doped with p-type dopants, such as boron or $BF_2$; n-type dopants, such as phosphorus or arsenic; or combinations thereof. The doped regions may be formed directly on the substrate 102, in a P-well structure, in an N-well structure, in a dual-well structure, and/or using a raised structure. The substrate 102 may further include various active regions, such as regions configured for an N-type metal-oxide-semiconductor transistor device and regions configured for a P-type metal-oxide-semiconductor transistor device.

The semiconductor device also includes a fin structure 110 formed over the substrate 102. The fin structure 110 may include Si, SiGe, silicon germanium tin (SiGeSn), GaAs, InAs, InP, or other suitable materials. In some embodiments, the fin structure 110 is formed by one or more suitable process(es) including various deposition, photolithography, and/or etching processes. As an example, the fin structure 110 is formed by patterning and etching a portion of the substrate 102. The fin structure 110 includes at least one channel portion 110A and at least one source/drain portion 110B adjacent to the channel portion 110A. For example, in FIG. 1A, the fin structure 110 includes three channel portions 110A and four source/drain portions 110B.

A plurality of isolation structures 120 are formed on the substrate 102 and adjacent to the fin structure 110. The isolation structures 120, which act as a shallow trench isolation (STI) around the fin structure 110 may be formed by chemical vapor deposition (CVD) techniques using tetra-ethyl-ortho-silicate (TEOS) and oxygen as a precursor. In yet some other embodiments, the isolation structures 120 are insulator layers of a SOI wafer. At least one of the isolation structures 120 includes at least one first portion 120A and at least one second portion 120B adjacent to the first portion 120A. For example, in FIG. 1A, one of the isolation structures 120 includes three first portion 120A and four second portions 120B. The first portions 120A are respectively disposed adjacent to the channel portions 110A of the fin structure 110, and the second portions 120B are respectively disposed adjacent to the source/drain portions 110B of the fin structure 110.

Reference is made to FIGS. 2A and 2B. A gate dielectric 125 is formed to cover the fin structure 110. The gate dielectric 125 may be formed by thermal oxidation, chemical vapor deposition, sputtering, or other methods known and used in the art for forming a gate dielectric. The gate dielectric 125 may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

A plurality of dummy gate structures 130 are formed over the gate dielectric 125, including wrapping over a portion of the fin structure 110. The dummy gate structures 130 cover the channel portions 110A (see FIG. 1A) of the fin structure 110 and the first portions 120A of the isolation structures 120, and the source/drain portion 110B of the fin structure 110 and the second portions 120B of the isolation structures 120 are exposed from the dummy gate structures 130.

In some embodiments, the dummy gate structures 130 can be replaced later by high-k/metal gate (HK/MG) (see FIGS. 11A and 11B). The dummy gate structures 130 may include a dielectric layer, or a polysilicon layer. The dummy gate structures 130 may be formed by one or more suitable process or processes, such as deposition, patterning, and etching. For example, a dummy layer (not shown) is formed on the gate dielectric 125, and a mask layer 140 (see FIGS. 3A and 3B) is formed on the dummy layer by suitable process(es) to a suitable thickness. The mask layer 140 covers a portion of the dummy layer while leaves other portions of the dummy layer uncovered. The mask layer 140, in some embodiments, is a hard mask layer which includes silicon oxide. The mask layer 140, in some other embodiments, may include silicon nitride (SiN), silicon oxynitride (SiON), silicon carbide (SiC), SiOC, spin-on glass (SOG), a low-κ film, tetraethylorthosilicate (TEOS), plasma enhanced CVD oxide (PE-oxide), high-aspect-ratio-process (HARP) formed oxide, amorphous carbon material, tetraethylorthosilicate (TEOS), other suitable materials, and/or combinations thereof. A removing (or etch) process is then performed to remove portions other than the intended pattern of the dummy layer (i.e., the portions uncovered by the mask layer 140) to form the dummy gate structures 130.

Reference is made to FIGS. 3A and 3B. The second portions 120B of the isolation structures 120 are recessed by performing one or more recessing process. As a result, a plurality of recesses 122 are respectively formed in the second portions 120B of the isolation structures 120. The dummy gate structures 130 are protected by the hard masks 140 during the recessing process. Since the second portions 120B are recessed, the height of the first portions 120A is higher than that of the second portions 120B.

The recessing process may include dry etching process, wet etching process, and/or combinations thereof. The recessing process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 4A:
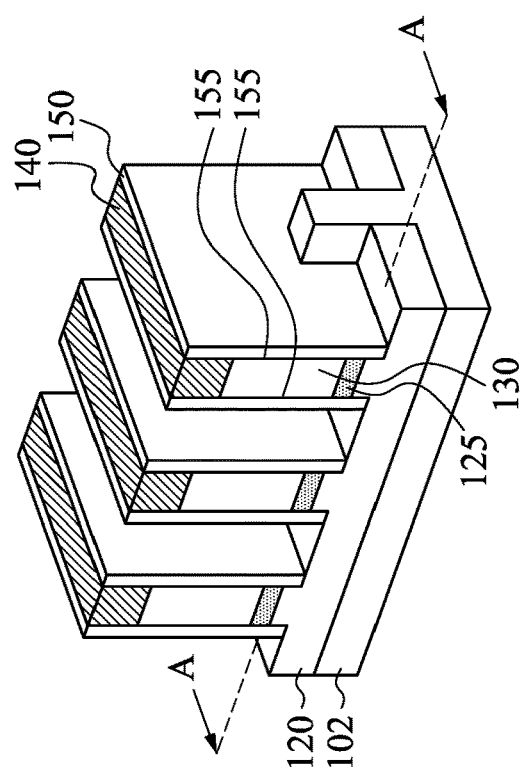

Reference is made to FIGS. 4A and 4B. A plurality of gate spacers 150 are formed over the substrate 102 and along the side of the dummy gate structures 130. In detail, the gate spacers 150 are formed on the opposite sidewalls 155 of the dummy gate structures 130, the hard masks 140, the gate dielectric 125, and the first portions 120A of the isolation structures 120. Further, a part of the second portions 120B of the isolation structures 120 are covered by the gate spacers 150. In FIGS. 4A and 4B, the gate spacers 150 extend to the top surface of the second portions 120B of the isolation structures 120 by performing a recessing process to the second portions 120B of the isolation structures 120 before forming the gate spacers 150.

In some embodiments, the gate spacers 150 may include silicon oxide, silicon nitride, silicon oxy-nitride, or other suitable material. The gate spacers 150 may include a single layer or multilayer structure. A blanket layer of the gate spacers 150 may be formed by CVD, PVD, ALD, or other suitable technique. Then, an anisotropic etching is performed on the blanket layer to form a pair of the gate spacers 150 on two sidewalls 155 of the dummy gate structures 130, the hard masks 140, the gate dielectric 125, and the first portions 120A of the isolation structures 120. In some embodiments, the gate spacers 150 are used to offset subsequently formed doped regions, such as source/drain regions. The gate spacers 150 may further be used for designing or modifying the source/drain region (junction) profile.

Figure 5:
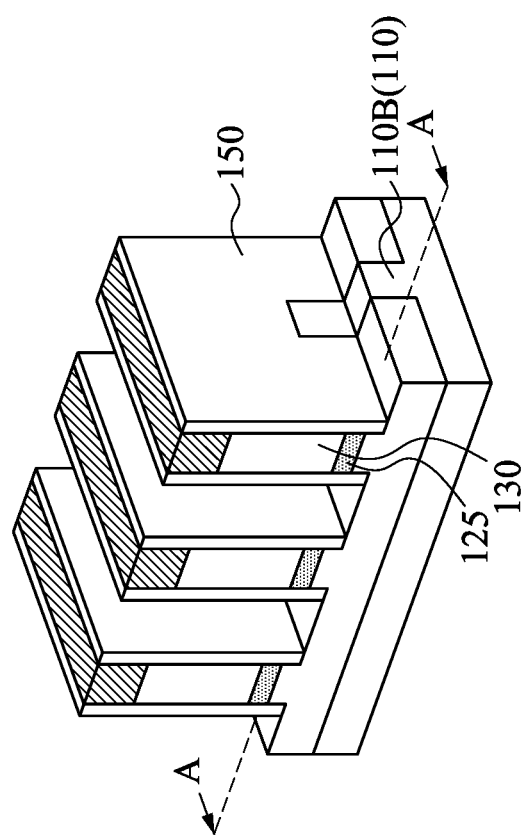

Reference is made to FIG. 5. The source/drain portions 110B of the fin structures 110 exposed both from the dummy gate structures 130 and the gate spacers 150 are partially removed (or partially trenched) by suitable processes, such as dry etching process, wet etching process, and/or combination thereof.

Reference is made to FIGS. 6A and 6B. A first cleaning process is performed to the remaining source/drain portions 110B of the fin structures 110. In detail, the first cleaning process cleans the top surface of the source/drain portions 110B of the fin structure 110 and the top surface of the second portions 120B of the isolation structures 120. During the first cleaning process, the first portions 120A of the isolation structure 120 are protected by the dummy gate structures 130 and the gate spacers 150. In some exemplary embodiments, a wet HF (hydrofluoric acid) etching or cleaning etch process may be used.

The top surface of the source/drain portions 110B of the fin structure 110 and the top surface of the second portions 120B of the isolation structures 120 are partially removed (or partially etched) during the first cleaning process. Thus, the source/drain portions 110B of the fin structure 110 have a top surface 110BS, and the second portions 120B of the isolation structures 120 have a top surface 120BS, in that the top surface 110BS and the top surface 120BS are concave (or curved). In some embodiments, the top surface 120BS of the second portions 120B of the isolation structures 120 may be over-etched, such that the top surface 120BS may extend under the gate spacers 150. That is, the vertical projection of the gate spacer 150 partially covers the top surface 120BS of the second portions 120B of the isolation structures 120.

Figure 7:
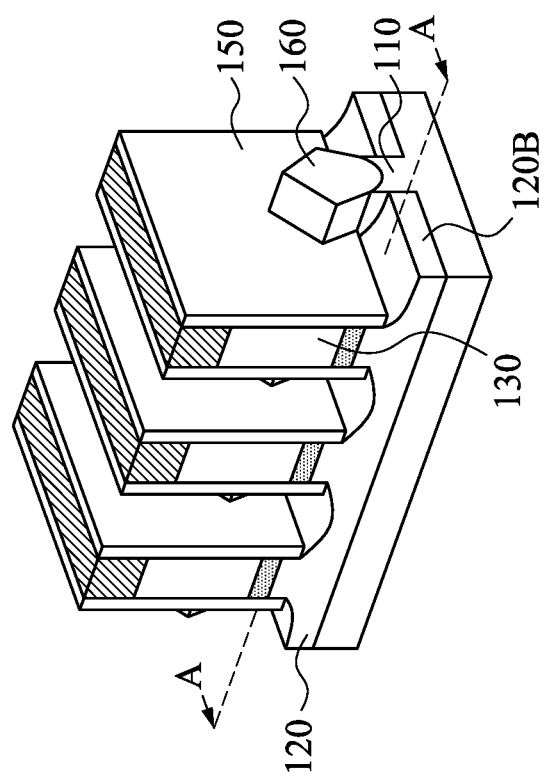

Reference is made to FIG. 7. A plurality of epitaxy structures 160 are respectively formed on the source/drain portions 110B of the fin structure 110. The epitaxy structures 160 are adjacent to the gate spacers 150 and the dummy gate structures 130. Also, the epitaxy structures 160 are adjacent to the second portions 120B of the isolation structures 120. The epitaxy structures 160 (and the source/drain portions 110B) of the fin structure 110 are source/drain features of the semiconductor device 100 (see FIGS. 11A and 11B). The epitaxy structure 160 can be an n-type epitaxy structure or a p-type epitaxy structure. The epitaxy structures 160 may be formed using one or more epitaxy or epitaxial (epi) processes, such that Si features, SiGe features, and/or other suitable features can be formed in a crystalline state on the fin structure 110. In some embodiments, lattice constants of the epitaxy structures 160 is different from lattice constants of the fin structure 110, and the epitaxy structures 160 is strained or stressed to enable carrier mobility of the semiconductor device and enhance the device performance. The epitaxy structures 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

In some embodiments, the epitaxy structures 160 may include SiP, SiC, SiPC, Si, III-V compound semiconductor materials, or combinations thereof for the n-type epitaxy structure, and the source/drain features 160 may include SiGe, SiGeC, Ge, Si, III-V compound semiconductor materials, or combinations thereof for the p-type epitaxy structure. The epitaxy structures 160 may have non-facet surfaces for the n-type epitaxy structure, and may have facet surfaces for the p-type epitaxy structure. During the formation of the n-type epitaxy structure, n-type impurities such as phosphorous or arsenic may be doped with the proceeding of the epitaxy. For example, when the epitaxy structures 160 include SiC or Si, n-type impurities are doped. Moreover, during the formation of the p-type epitaxy structure, p-type impurities such as boron or BF2 may be doped with the proceeding of the epitaxy. For example, when the epitaxy structures 160 include SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 110 (e.g., silicon). Thus, a strained channel can be achieved to increase carrier mobility and enhance device performance. The epitaxy structures 160 may be in-situ doped. If the epitaxy structures 160 are not in-situ doped, a second implantation process (i.e., a junction implant process) is performed to dope the epitaxy structures 160. One or more annealing processes may be performed to activate the epitaxy structures 160. The annealing processes include rapid thermal annealing (RTA) and/or laser annealing processes.

Figure 8B:
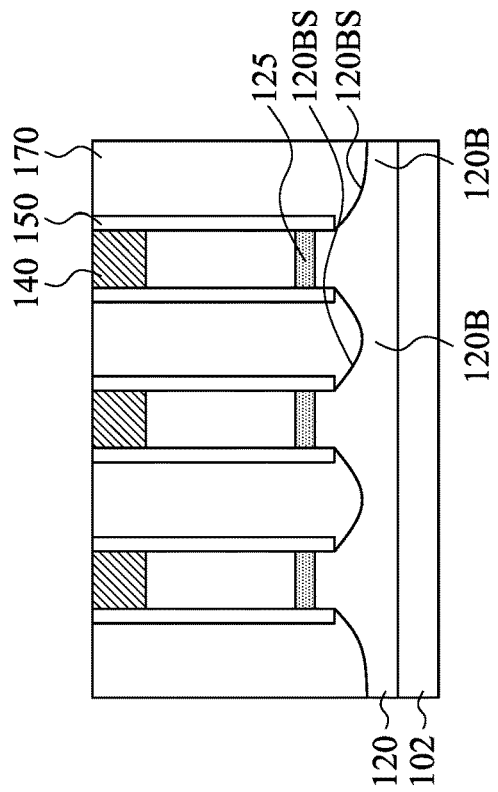
Figure 8A:
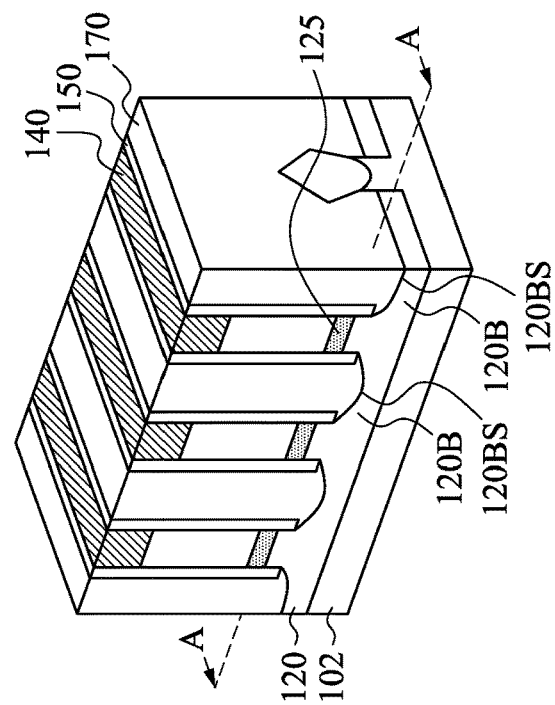

Reference is made to FIGS. 8A and 8B. In some embodiments, after forming the epitaxy structures 160, a dielectric layer 170 is formed on the substrate 102 and at outer sides of the gate spacers 150. Accordingly, the dielectric layer 170 covers the second portions 120B of the isolation structure 120. That is, the dielectric layer 170 covers the top surface 120BS of the second portions 120B of the isolation structure 120. The dielectric layer 170 may include silicon oxide, oxynitride or other suitable materials. The dielectric layer 170 includes a single layer or multiple layers. The dielectric layer 170 can be formed by a suitable technique, such as CVD or ALD. A chemical mechanical planarization (CMP) process may be applied to remove excessive dielectric layer 170 and expose the top surface of the hard mask 140 to a subsequent dummy gate removing process.

Figure 9B:
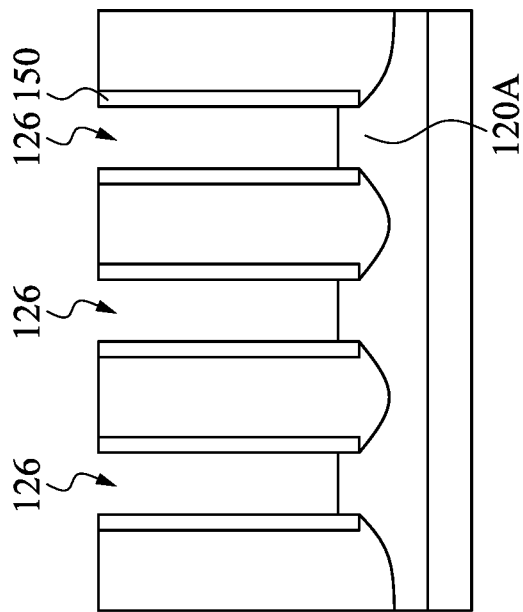
Figure 9A:
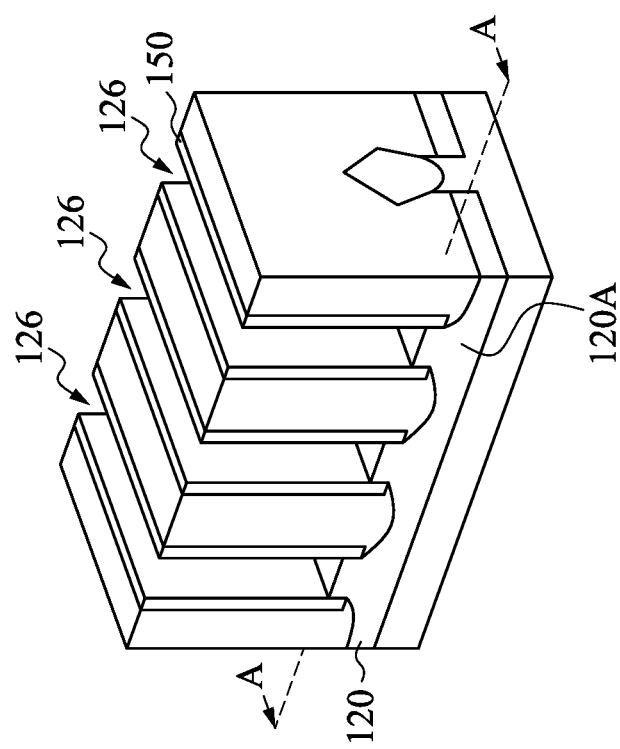

Reference is made to FIGS. 9A and 9B. A replacement gate (RPG) process scheme is employed. In some embodiments, in a RPG process scheme, a dummy gate structure is formed first and is replaced later by a metal gate after high thermal budget processes are performed. In some embodiments, the hard masks 140, the dummy gate structures 130, and the gate dielectric 125 (shown in FIGS. 8A and 8B) are removed to form a plurality of openings 126 between the gate spacers 150. The hard masks 140, the dummy gate structures 130, and the gate dielectric 125 may be removed by dry etch, wet etch, or a combination of dry and wet etch. For example, a wet etch process may include exposure to a hydroxide containing solution (e.g., ammonium hydroxide), deionized water, and/or other suitable etchant solutions.

Reference is made to FIGS. 10A and 10B. A second cleaning process is performed to the first portions 120A of the isolation structure 120 to remove a native oxide of the fin structure 110 on the semiconductor substrate 102 through the openings 126 between the gate spacers 150. In some embodiments, the second cleaning process may also clean the first portions 120A of the isolation structures 120 through the openings 126 between the gate spacers 150. In detail, the second cleaning process cleans the top surface of the first portions 120A of the isolation structures 120. In some exemplary embodiments, a wet HF (hydrofluoric acid) etching or cleaning etch process may be used.

The top surface of the first portions 120A of the isolation structures 120 is partially removed (or partially etched) during the second cleaning process. Thus, the first portions 120A of the isolation structures 120 have a top surface 120AS, in that the top surface 120AS is concave (or curved).

Reference is made to FIGS. 11A and 11B. A plurality of gate structures 180 is formed in the openings 126 to form the semiconductor device 100. In other words, the gate spacers 150 are disposed on opposite sides of the gate structures 180. The gate structures 180 are formed on the first portions 120A of the isolation structures 120. The gate structures 180 formed may also include gate dielectric layer(s), capping layer(s), fill layer(s), and/or other suitable layers that are desirable in a metal gate stack. A work function metal layer included in the gate structures 180 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process. In some embodiments, the gate structures 180 formed is a p-type metal gate including a p-type work function layer. In some embodiments, the capping layer included in the gate structures 180 may include refractory metals and their nitrides (e.g. TiN, TaN, W2N, TiSiN, TaSiN). The cap layer may be deposited by PVD, CVD, Metal-organic chemical vapor deposition (MOCVD) and ALD. In some embodiments, the fill layer included in the gate structures 180 may include tungsten (W). The metal layer may be deposited by ALD, PVD, CVD, or other suitable process.

In some embodiments of the present disclosure, the top surface 120AS of the first portions 120A and the top surface 120BS of the second portions 120B of the isolation structures 120 are concave (or curved) by performing the cleaning processes, such as the second cleaning process and the first cleaning process, respectively. The top surface 120AS of the first portions 120A are spatial apart from the top surface 120BS of the second portions 120B. The top surface 120AS of the first portions 120A is higher than the top surface 120BS of the second portions 120B. In other words, the height 120AH of the first portions 120A of the isolation structures 120 is greater than the height 120BH of the second portions 120B of the isolation structures 120. Moreover, the top surface 120AS of the first portions 120A is in contact with the gate structures 180 and is higher than a bottommost surface 150BS of the gate spacers 150.

In some embodiments, a part 120A' of the first portions 120A of the isolation structures 120 are disposed under the gate structures 180 and between the gate spacers 150, and may also be in contact with the sidewalls 150S of the gate spacers 150. The second portions 120B of the isolation structures 120 are disposed under the dielectric layer 170, and at least a part of the dielectric layer 170 is disposed between the second portions 120B of the isolation structures 120 and the gate spacers 150. That is, the top surface 120BS of the second portions 120B of the isolation structures 120 may extend under the gate spacers 150, and a part of the dielectric layer 170 may be disposed under the gate spacers 150, accordingly.

Another recessing process may be performed to the dielectric layer to form a plurality of openings (not shown) that expose the source/drain features (i.e., the epitaxy structure 160 in FIG. 11A). Metal such as tungsten is then deposited into the openings down to the source/drain features to form source/drain contacts (not shown) in the dielectric layer 170.

FIGS. 12A-12D are cross-sectional views of a method for manufacturing a semiconductor device 100 at various stages in accordance with some embodiments of the present disclosure. FIGS. 13A-13E are cross-sectional views of a method for manufacturing a semiconductor device 100 at various stages in accordance with some embodiments of the present disclosure. Some details are not repeated here to avoid duplicity Referring back to FIG. 3B, in some embodiments, the recessing process of the second portion 120B of the isolation structures 120 further includes tuning the profiles of the first portions 120A of the isolation structures 120. In FIG. 3B, the recessing process is performed by an anisotropic etching, such as a dry etching, such that the first portions 120A of the isolation structures 120 have substantial vertical sidewalls.

Figure 12A:
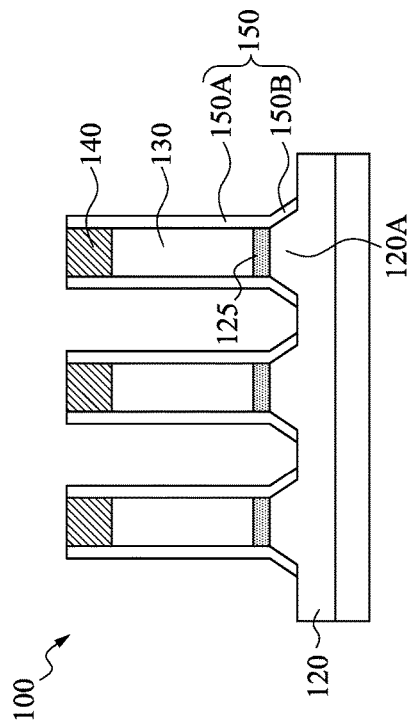
FIGS. 12A-12D are cross-sectional views of a method for manufacturing a semiconductor device at various stages in accordance with some embodiments of the present disclosure.

Referring to FIG. 12A, a recessing process similar to FIG. 3B is performed in advance. The recessing process is performed to the first portions 120A of isolation structures 120 through recesses 122 between dummy gate structures 130 by an isotropic etching, such as a wet etching. Accordingly, the first portions 120A of the isolation structures 120 have tapered profiles. That is, the first portions 120A of the isolation structures 120 get narrower toward the dummy gate structures 130.

Figure 12B:
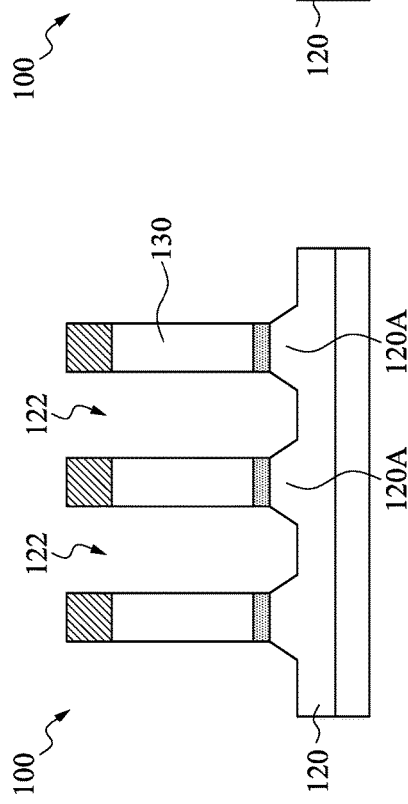

Referring to FIG. 12B, a plurality of gate spacers 150 are formed over the substrate 102 and along the side of the dummy gate structures 130. The gate spacers 150 are formed on the opposite sidewalls of the dummy gate structures 130, the hard masks 140, and the first portions 120A of the isolation structures 120. The gate spacers 150 include a straight portion 150A and an inclined portion 150B, in that the inclined portion 150B is in contact with the first portions 120A of the isolation structures 120, and the straight portion 150A is in contact with the dummy gate structures 130.

Figure 12C:
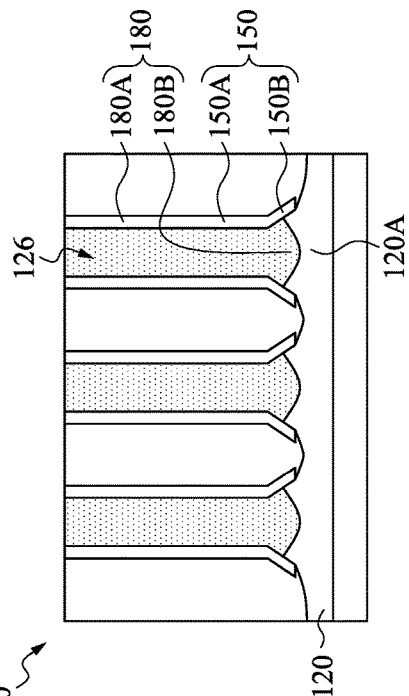

Reference is made to FIG. 12C. A first cleaning process is performed to the second portions 120B of the isolation structures 120. The first cleaning process cleans the top surface of the second portions 120B of the isolation structures 120. After performing the first cleaning process, a plurality of epitaxy structures may be formed over the substrate 102, as shown if FIG. 7, and a dielectric layer 170 is formed on the substrate 102 and covers the second portions 120B of the isolation structure 120.

Figure 12D:
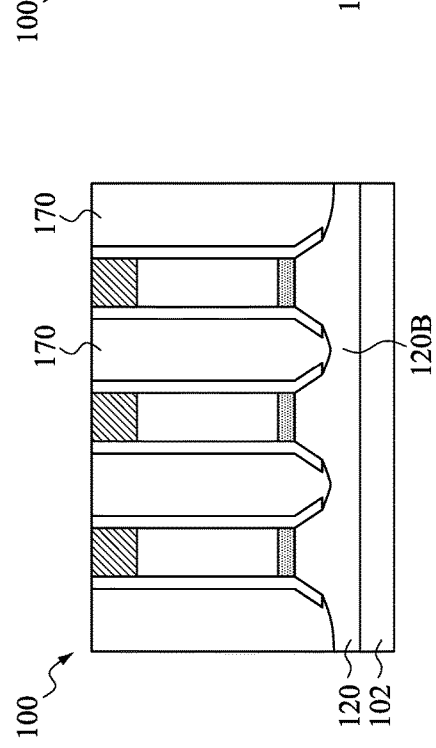

Reference is made to FIG. 12D. A replacement gate (RPG) process scheme is employed. In some embodiments, the hard masks 140, the dummy gate structures 130, and the gate dielectric 125 (shown in FIG. 12B) are removed to form a plurality of openings 126 between the gate spacers 150. After removing the hard masks 140, the dummy gate structures 130, and the gate dielectric 125, a second cleaning process is performed to the first portions 120A of the isolation structures 120, such that the top surface of the first portions 120A of the isolation structures 120 is partially removed (or partially etched).

A plurality of gate structures 180 is then formed in the openings 126. The gate structures 180 include a straight portion 180A and a tapered portion 180B connected to the straight portion 180A. The tapered portion 180B gets wider toward the first portion 120A of the isolation structure 120. The tapered portions 180B of the gate structures 180 are formed according to the profiles of the gate spacers 150. The tapered portions 180B of the gate structures 180 are in contact with the first portions 120A of the isolation structures 120 and/or the inclined portions 150B of the gate spacers 150. Moreover, the first portions 120A of the isolation structures 120 between the gate spacers 150 have tapered profiles.

Referring to FIG. 13A, a recessing process similar to FIG. 3B is performed in advance. The recessing process is performed to the first portions 120A of isolation structures 120 through recesses 122 between dummy gate structures 130 by an anisotropic etching, such as a dry etching. Accordingly, the first portions 120A of the isolation structures 120 have substantially straight profiles. The term "substantially" as used herein may be applied to modify any quantitative representation which could permissibly vary without resulting in a change in the basic function to which it is related.

Reference is made to FIG. 13B. An isotropic etching is performed after performing the anisotropic etching show in FIG. 13A. Accordingly, the first portions 120A of the isolation structures 120 are further etched and have notched profiles. That is, the first portions 120A gets wider toward the dummy gate structure 130.

Referring to FIG. 13C, a plurality of gate spacers 150 are formed over the substrate 102 and along the side of the dummy gate structures 130. The gate spacers 150 are formed on the opposite sidewalls of the dummy gate structures 130, the hard masks 140, and the first portions 120A of the isolation structures 120. The gate spacers 150 include a straight portion 150A and an inclined portion 150B, in that the inclined portion 150B is in contact with the first portions 120A of the isolation structures 120, and the straight portion 150A is in contact with the dummy gate structures 130.

Reference is made to FIG. 13D. A first cleaning process is performed to the second portions 120B of the isolation structures 120. The first cleaning process cleans the top surface of the second portions 120B of the isolation structures 120. After performing the first cleaning process, a plurality of epitaxy structures 160 may be formed over the substrate, as shown in FIG. 7, and a dielectric layer 170 is formed on the substrate 102 and covers the second portions 120B of the isolation structure 120.

Reference is made to FIG. 13E. A replacement gate (RPG) process scheme is employed. In some embodiments, the hard masks 140, the dummy gate structures 130, and the gate dielectrics 125 (shown in FIG. 13C) are removed to form a plurality of openings 126 between the gate spacers 150. After removing the hard masks 140, the dummy gate structures 130, and the gate dielectrics 125, a second cleaning process is performed to the first portions 120A of the isolation structures 120, such that the top surface of the first portions 120A of the isolation structures 120 is partially removed (or partially etched).

A plurality of gate structures 180 is then formed in the openings 126. The gate structures 180 include a straight portion 180A and a notched portion 180B connected to the straight portion 180A. The notched portions 180B get narrower toward the first portions 120A of the isolation structures 120. The notched portions 180B of the gate structures 180 are formed according to the profiles of the gate spacers 150. The notched portions 180B of the gate structures 180 are in contact with the first portions 120A of the isolation structures 120 and/or the inclined portions 150B of the gate spacers 150. Moreover, the first portions 120A of the isolation structures 120 between the gate spacers 150 have notched profiles.

Figures 14A, 14B:
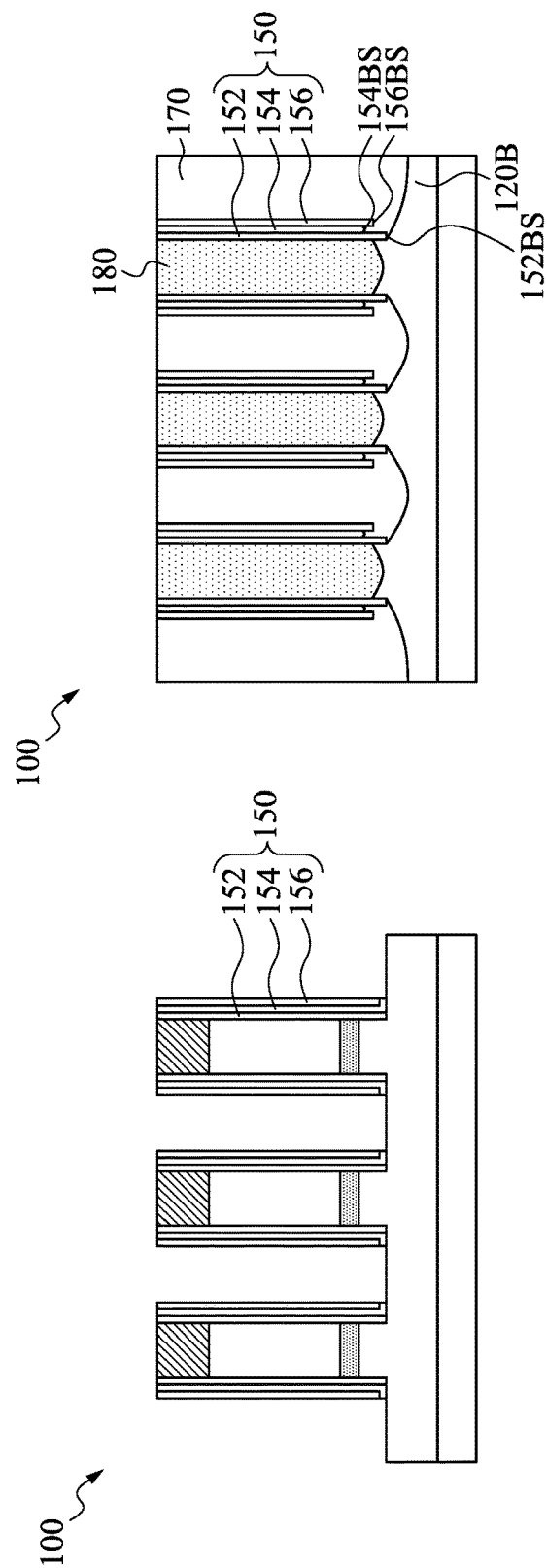
FIGS. 14A-14B are cross-sectional views of a method for manufacturing a semiconductor device at various stages in accordance with some embodiments of the present disclosure.

FIGS. 14A-14B are cross-sectional views of a method for manufacturing a semiconductor device 100 at various stages in accordance with some embodiments of the present disclosure. In some embodiments, a plurality of gate spacers 150 may include multi-layer configuration.

Reference is made to 14A, the gate spacers 150 includes a first dielectric layer 152, a second dielectric layer 154, and a third dielectric layer 154. In some embodiments, the gate spacers 150 may include forming the first dielectric layers 152 over the substrate 102; etching the first dielectric layers 152; forming the second dielectric layers 154 and a third dielectric layers 154 over the substrate 102; etching the second dielectric layers 154 and a third dielectric layers 154. In some other embodiments, however, the first dielectric layer 152, the second dielectric layer 154, and the third dielectric layer 154 may be formed in sequence and then be patterned together, or the first dielectric layer 152, the second dielectric layer 154, and the third dielectric layer 154 may be formed and patterned individually. In some embodiments, the first dielectric layers 152 and the third dielectric layers 154 are made from nitrides, and the second dielectric layers 154 are made from oxides.

Reference is made to 14B, the semiconductor device 100 is employed with processes shown in FIGS. 5-11B. The first dielectric layers 152 of the gate spacers 150 are in contact with the gate structures 180. In some embodiments, the second dielectric layers 154 made from oxides may be partially etched during the first cleaning process performed to the second portions 120B of the isolation structures 120. Thus, the bottom surface 154BS of the second dielectric layers 154 is higher than the bottom surface 152BS of the first dielectric layers 152 and the bottom surface 156BS of the third dielectric layer 156. In other words, portions of the dielectric layer 170 may be formed between the first dielectric layers 152 and the third dielectric layer 156.

Figure 15:
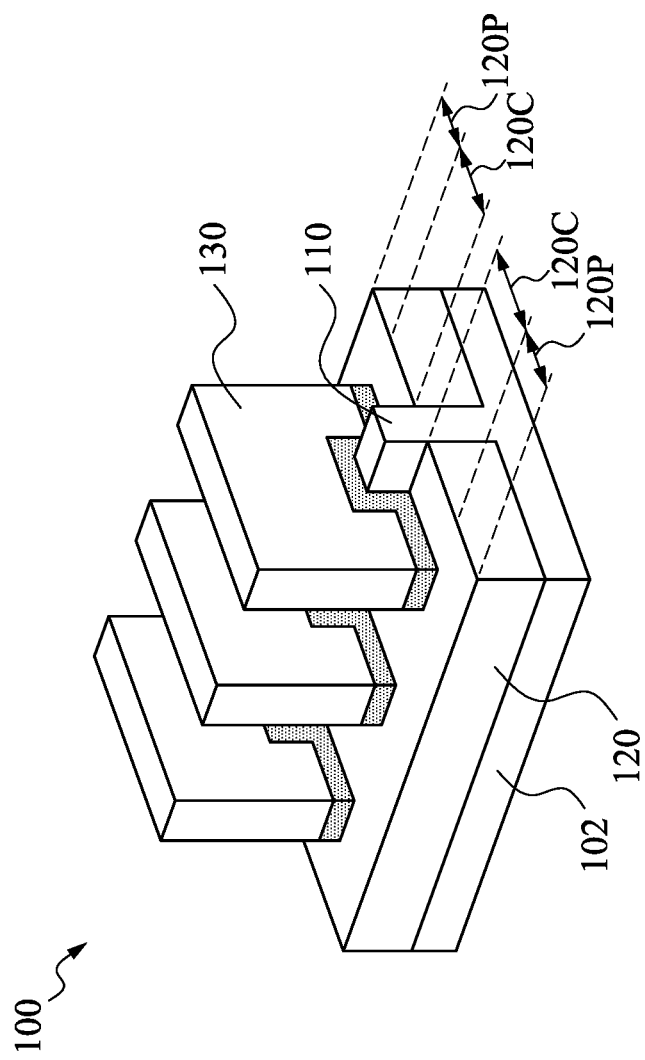
FIGS. 15, 16A, and 16B are perspective views of methods for manufacturing semiconductor devices at various stages in accordance with some embodiments of the present disclosure.
Figure 16A:
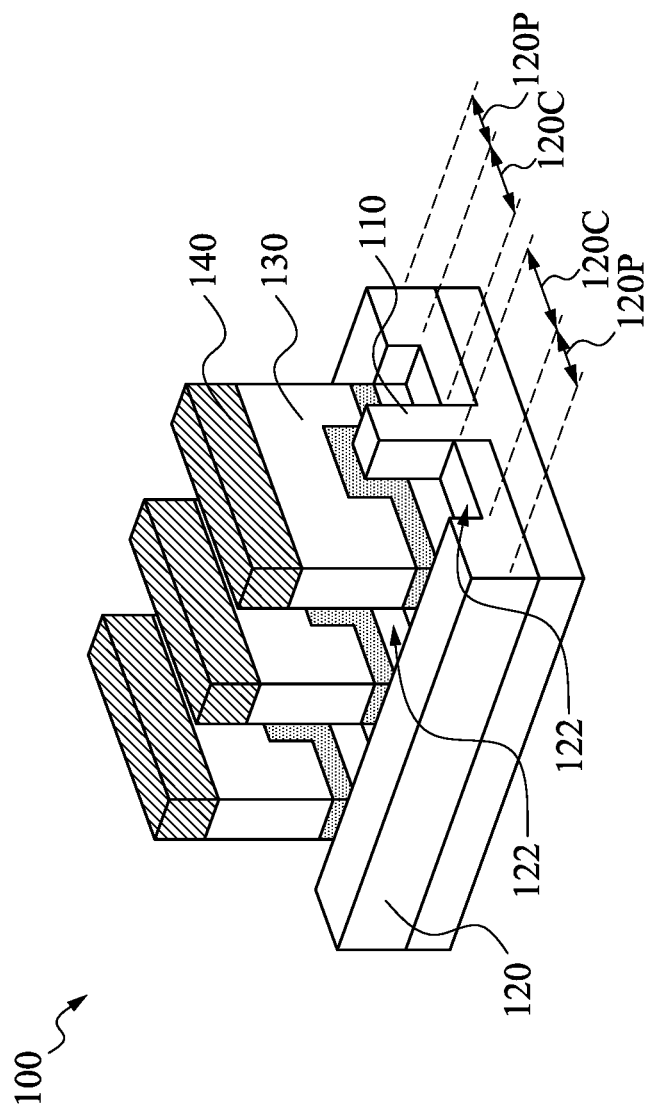
Figure 16B:
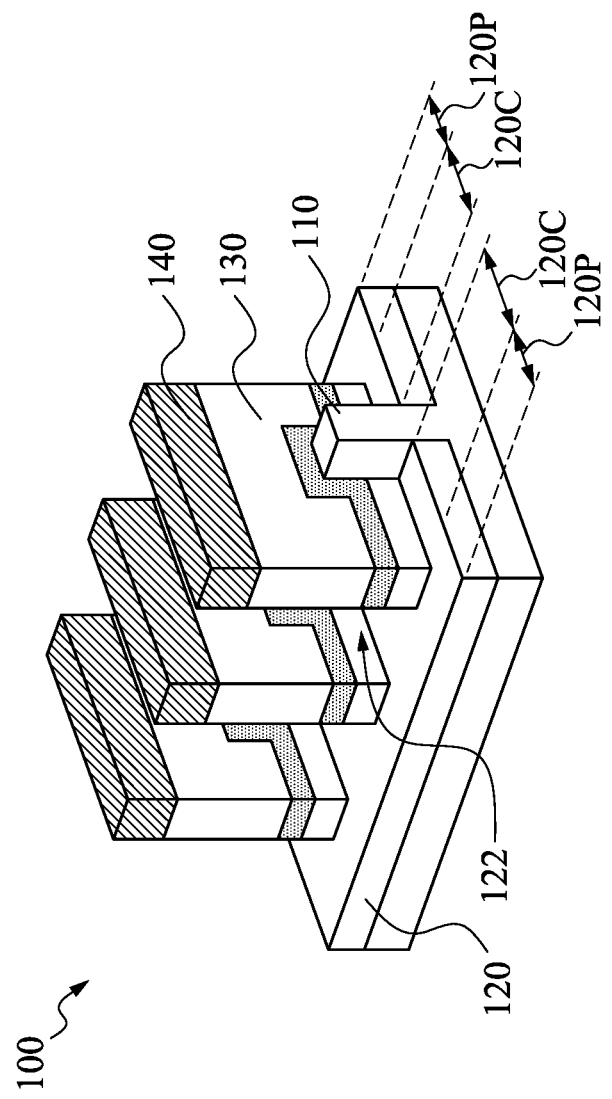

FIGS. 15, 16A, and 16B are perspective view of a method for manufacturing semiconductor devices 100 at various stages in accordance with some embodiments of the present disclosure.

Reference is made to FIG. 15. Similar to FIG. 2A, a fin structure 110 is formed on a substrate 102, and a plurality of isolation structures 120 are formed on the substrate 102 and adjacent to the fin structure 110. A plurality of dummy gate structures 130 are formed on the fin structures 110 and isolation structures 120. The isolation structures 120 includes a central region 120C and a peripheral region 120P connected to the central region 120C, in which the central region 120C of the isolation structures 120 is contact with the fin structure 110 and the dummy gate structures 130. The central region 120C is disposed between the peripheral region 120P and the fin structure 110. Other relevant structural details of the semiconductor device 100 of FIG. 15 are similar to the semiconductor device 100 of FIG. 11A, and, therefore, a description in this regard will not be repeated hereinafter.

Reference is made to FIG. 16A. A recessing process is performed to the isolation structures 120. A plurality of hard masks 140 are disposed on the dummy gate structures 130. In some embodiments, another mask layer (not shown) may be formed on the peripheral regions 120P of the isolation structures 120, such that the dummy gate structures 130 and the peripheral regions 120P of the isolation structures 120 are protected during the recessing process. In other words, the central regions 120C of the isolation structures 120 are recessed, but the peripheral regions 120P of the isolation structures 120 retain after the recessing process. Accordingly, a plurality of recesses 122 are formed in the central regions 120C of the isolation structures 120. The semiconductor device 100 may employ a plurality of processes as shown in FIGS. 4A-11B. Other relevant structural details of the semiconductor device 100 of FIG. 15 are similar to the semiconductor device 100 of FIG. 11A, and, therefore, a description in this regard will not be repeated hereinafter.

Reference is made to FIG. 16B. The difference between FIG. 16B and FIG. 16A pertains to the profile of the peripheral regions 120P of the isolation structures 120. In FIG. 16B, the central regions 120C and the peripheral regions 120P of the isolation structures 120 are both recessed. That is, the surface of the isolation structures 120 exposed from the dummy gate structures 130 are recessed. Accordingly, a plurality of recesses 122 are formed in the central regions 120C and the peripheral regions 120P of the isolation structures 120. The semiconductor device 100 may employ a plurality of processes as shown if FIGS. 4A-11B. Other relevant structural details of the semiconductor device 100 of FIG. 15 are similar to the semiconductor device 100 of FIG. 11A, and, therefore, a description in this regard will not be repeated hereinafter.

According to the aforementioned embodiments, a recessing process is performed to isolation structures of a semiconductor device before forming gate spacers, such that a plurality of gate spacers formed later may further extend to the recessed portion of the isolation structures. During cleaning processes performed to the semiconductor device, the isolation structures may be partially removed. The gate spacers extending to the recessed portion of the isolation structures may act as a blocking layer to prevent short circuit between source/drain regions and gate regions of the semiconductor device. With this configuration, the performance of the semiconductor device can be improved.

According to some embodiments, a semiconductor device includes a substrate; at least one source/drain feature at least partially disposed in the substrate; an isolation structure disposed on the substrate and includes a first portion; a gate structure disposed on the first portion of the isolation structure and adjacent to the source/drain feature; and at least one gate spacer disposed on a sidewall of the gate structure, in which a top surface of the first portion of the isolation structure is in contact with the gate structure and is higher than a bottommost surface of the gate spacer.

According to some embodiments, a semiconductor device includes a substrate having at least one fin structure, in which the fin structure has a channel portion and at least one source/drain portion adjacent to the channel portion; an isolation structure disposed on the substrate and comprises a first portion adjacent to the channel portion of the fin structure; a gate structure disposed on the first portion of the isolation structure and the channel portion of the fin structure; and two gate spacers respectively disposed on opposite sidewalls of the gate structure, in which a part of the first portion of the isolation structure is disposed between the gate spacers.

According to some embodiments, A method for manufacturing a semiconductor device includes forming at least one fin structure on a substrate; forming an isolation structure on the substrate and adjacent to the fin structure; forming a gate structure on the fin structure and the isolation structure; recessing a first portions of the isolation structure uncovered by the gate structure; and forming two gate spacers respectively on opposite sidewalls of the gate structure and on the recessed first portions of the isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate;
at least one source/drain feature at least partially disposed in the substrate;
an isolation structure disposed on the substrate and comprises a first portion;
a gate structure disposed on the first portion of the isolation structure and adjacent to the source/drain feature; and
at least one gate spacer disposed on a sidewall of the gate structure,
wherein a top surface of the first portion of the isolation structure is in contact with the gate structure and is higher than a bottommost surface of the gate spacer;
wherein the gate spacer includes an upper portion and a lower portion;
wherein an inner sidewall of the upper portion and an inner sidewall of the lower portion form an angle therebetween; and
wherein the inner sidewall of the lower portion tapers away from the source/drain feature.

2. The semiconductor device of claim 1, wherein the isolation structure further comprises a second portion adjacent to the first portion of the isolation structure and the source/drain feature, and the top surface of the first portion of the isolation structure is higher than a top surface of the second portion of the isolation structure.

3. The semiconductor device of claim 2, wherein the top surface of the first portion of the isolation structure and the top surface of the second portion of the isolation structure are concave.

4. The semiconductor device of claim 1, wherein the gate spacer has a multi-layer configuration.

5. The semiconductor device of claim 1, wherein the gate spacer comprises:
a first dielectric layer in contact with the gate structure; and
a second dielectric layer and a third dielectric layer, wherein the second dielectric layer is disposed between the first dielectric layer and the third dielectric layer, wherein a bottom surface of the second dielectric layer is higher than a bottom surface of the first dielectric layer and a bottom surface of the third dielectric layer.

6. The semiconductor device of claim 1, wherein the gate structure has a notched portion in contact with the first portion of the isolation structure.

7. The semiconductor device of claim 1, wherein the sidewall of the gate structure is adjacent the source/drain feature.

8. A semiconductor device, comprising:
a substrate having at least one fin structure, wherein the fin structure has a channel portion and at least one source/drain portion adjacent to the channel portion;
an isolation structure disposed on the substrate and comprises a first portion adjacent to the channel portion of the fin structure;
a gate structure disposed on the first portion of the isolation structure and the channel portion of the fin structure and having substantially the same width as the first portion of the isolation structure; and
two gate spacers respectively disposed on opposite sidewalls of the gate structure,
wherein a part of the first portion of the isolation structure is disposed between the gate spacers;
wherein at least one of the gate spacers comprises a first dielectric layer, a second dielectric layer, and a third dielectric layer;
wherein the second dielectric layer is between the first and third dielectric layers; and
wherein a bottom surface of the second dielectric layer is above a bottom surface of the first dielectric layer and a bottom surface of the third dielectric layer.

9. The semiconductor device of claim 8, wherein the isolation structure further comprises a second portion adjacent to the first portion of the isolation structure and the source/drain portion of the fin structure, and a top surface of the first portion of the isolation structure is higher than a top surface of the second portion of the isolation structure.

10. The semiconductor device of claim 9, wherein the top surface of the first portion of the isolation structure and the top surface of the second portion of the isolation structure are curved.

11. The semiconductor device of claim 8, wherein the first portion of the isolation structure is in contact with a sidewall of at least one of the gate spacers.

12. The semiconductor device of claim 11, wherein a height of the first portion of the isolation structure is greater than a height of a second portion of the isolation structure.

13. The semiconductor device of claim 8, wherein the part of the first portion of the isolation structure disposed between the gate spacers has a tapered profile.

14. The semiconductor device of claim 8, wherein the part of the first portion of the isolation structure disposed between the gate spacers has a notched profile.

15. The semiconductor device of claim 8, wherein the inner sidewall of the upper portion of the gate spacer is substantially perpendicular to a top surface of the substrate.

16. A method for manufacturing a semiconductor device, comprising:
forming at least one fin structure on a substrate;
forming an isolation structure on the substrate and adjacent to the fin structure;
forming a gate structure on the fin structure and the isolation structure;
recessing the isolation structure uncovered by the gate structure to form first and second portions of the isolation structure, wherein a top surface of the second portion is below a top surface of the first portion;
after recessing the isolation structure, forming two gate spacers respectively on opposite sidewalls of the gate structure and on the second portion of the isolation structure; and
after recessing the isolation structure and forming the two gate spacers, performing a first cleaning process to the second portion of the isolation structure such that a bottom surface of at least one of the gate spacers is separated from the second portion of the isolation structure.

17. The method of claim 16, further comprising:
removing the gate structure; and
performing a second cleaning process to the first portion of the isolation structure between the gate spacers.

18. The method of claim 16, wherein recessing the isolation structure comprises tuning a profile of the first portion of the isolation structure.

19. The method of claim 18, wherein tuning the profile of the first portion of the isolation structure comprises:
performing an anisotropic etching process to the isolation structure uncovered by the gate structure; and
performing an isotropic etching process to the isolation structure uncovered by the gate structure after performing the anisotropic etching process.

20. The method of claim 18, wherein the tuning the profile of the first portion of the isolation structure comprises performing an isotropic etching process to the isolation structure uncovered by the gate structure.

* * * * *